United States Patent
Omura

(10) Patent No.: US 10,103,527 B2
(45) Date of Patent: Oct. 16, 2018

(54) SHIELDED HARNESS INCLUDING MOLDED BODY AND FIXING MEMBER

(71) Applicant: Mitsubishi Electric Corporation, Tokyo (JP)

(72) Inventor: Takashi Omura, Tokyo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 0 days.

(21) Appl. No.: 15/592,534

(22) Filed: May 11, 2017

(65) Prior Publication Data

US 2018/0013273 A1    Jan. 11, 2018

(30) Foreign Application Priority Data

Jul. 5, 2016    (JP) .................................. 2016-133038

(51) Int. Cl.
*H01B 7/18*    (2006.01)
*H02G 3/32*    (2006.01)
(Continued)

(52) U.S. Cl.
CPC ......... *H02G 3/0406* (2013.01); *H01B 7/0045* (2013.01); *H01B 7/18* (2013.01);
(Continued)

(58) Field of Classification Search
CPC ...... H05K 9/0098; H02G 3/0431; H02G 3/32; H02G 3/34; H02G 3/0406; H01B 7/0045; H01B 7/18
(Continued)

(56) References Cited

U.S. PATENT DOCUMENTS 1,984,356 A * 12/1934 Abbott ..................... H02G 3/00
174/117 A
9,045,092 B2 * 6/2015 Toyama .............. B60R 16/0207
(Continued)

FOREIGN PATENT DOCUMENTS

JP    03-000097 U    1/1991
JP    05-080118 U    10/1993
(Continued)

OTHER PUBLICATIONS

Communication dated Oct. 3, 2017 from the Japanese Patent Office in counterpart application No. 2016-133038.
(Continued)

*Primary Examiner* — Michael F McAllister
(74) *Attorney, Agent, or Firm* — Sughrue Mion, PLLC; Richard C. Turner

(57) ABSTRACT

A shielded harness is simply constructed such that covered wires are fitted into a groove of a molded body, and then an opening of the groove is covered with a metal casing. This simple structure allows noise to be released to the metal casing, which functions as a ground, via a metal plate constituting the molded body when the noise is generated at a control system unit or comes from an external device. The metal casing of the shielded harness can be used as a housing of a device, such as a power converter, and therefore, a fixing tool is not required for wiring, and the wiring is made easy. Moreover, compared with a conventional shielded wire, this shielded harness has a small number of parts and is produced by an easy method, thereby allowing reduction in production cost.

9 Claims, 4 Drawing Sheets

(51) Int. Cl.
  *H02G 3/34* (2006.01)
  *H02G 3/04* (2006.01)
  *H01B 7/00* (2006.01)
  *H05K 9/00* (2006.01)

(52) U.S. Cl.
  CPC ......... *H05K 9/0098* (2013.01); *H02G 3/0431* (2013.01); *H02G 3/32* (2013.01); *H02G 3/34* (2013.01)

(58) Field of Classification Search
  USPC ...................................................... 174/72 A
  See application file for complete search history.

(56) References Cited

U.S. PATENT DOCUMENTS 9,327,660 B2 * 5/2016 Suetani ................ H01R 13/504

2002/0062979 A1 * 5/2002 Murakami ........... H01B 7/0861
  174/117 F
2013/0008710 A1 1/2013 Toyama et al.
2015/0027772 A1 * 1/2015 Hashimoto ......... B60R 16/0215
  174/382

FOREIGN PATENT DOCUMENTS

| | | |
|---|---|---|
| JP | 08-196016 A | 7/1996 |
| JP | 2005-222832 A | 8/2005 |
| JP | 2011-192578 A | 9/2011 |

OTHER PUBLICATIONS

Communication dated Jul. 4, 2017, issued from the Japan Patent Office in counterpart Application No. 2016-133038.

* cited by examiner

SHIELDED HARNESS INCLUDING MOLDED BODY AND FIXING MEMBER

BACKGROUND OF THE INVENTION

Field of the Invention

The present invention relates to a shielded harness having shielded wires and specifically relates to a shielded harness that connects between controlling units of a power converter.

Description of the Background Art

A shielded harness, which has a connector at an end of each shielded wire, transmits control signals between internal control system units of a power converter or between a power converter and an external control device, and the shielded harness prevents malfunction due to noise. Patent Document 1 discloses a conventional shielded wire having a structure as shown in FIG. 4. In this structure, multiple covered wires and a drain wire are wrapped with a metal tape so that the drain wire contacts the metal tape, and a sheath for canceling a magnetic field is arranged around an outer circumference of the bundled wires.

The conventional shielded wire having such a structure allows noise, which is generated at a control system unit or comes from an external device, to transmit to the metal tape and to be released to the outside of the shielded wire via the drain wire, thereby preventing the noise from entering a core wire.

[Patent Document 1] JP-A-2005-222832

Such a conventional shielded wire must be used by fastening the drain wire to a metal casing, which functions as a ground (GND), to provide a path for conducting noise. Moreover, the shielded wire must be wired with a fixing tool, and therefore, the part cost is increased, and the wiring takes time. Furthermore, the sheath is made of an insulative synthetic resin and must be formed by extrusion molding, and thus, the production process is complicated, and production cost is high.

SUMMARY OF THE INVENTION

The present invention has been completed to solve the above problems, and an object of the invention is to provide a shielded harness that is easy to wire and that has a simple structure allowing reduction in production cost.

A shielded harness relating to the invention includes a covered wire having a connector at each end of the covered wire, a molded body containing a conductive material and having a groove for receiving the covered wire, a metal casing arranged to close an opening of the groove of the molded body and electrically connected to the molded body, and a fixing member fixing the molded body to the metal casing.

The shielded harness relating to the invention is constituted by putting the covered wire in the groove of the molded body and closing the opening of the groove with the metal casing. This simple structure has a small number of parts and is produced by an easy production process, thereby allowing reduction in production cost. The metal casing can be used as a part of a housing of an electronic device, and therefore, a fixing tool for wiring is not required, and the wiring is made easy.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

First Embodiment

Figure 1:
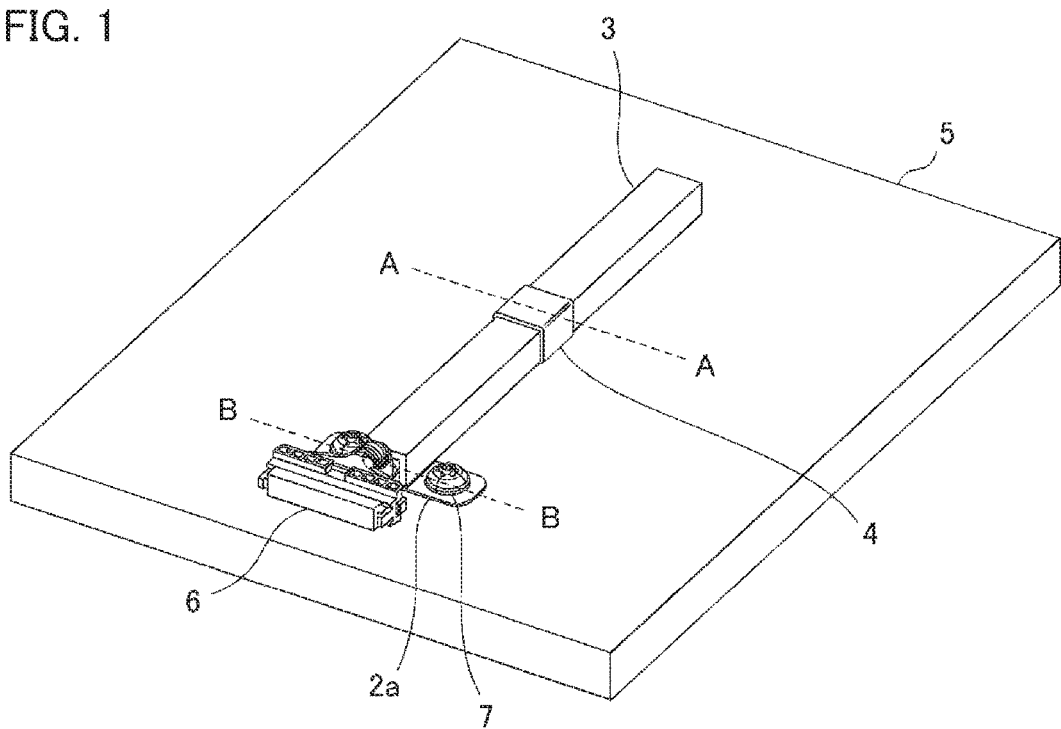
FIG. 1 is a perspective view showing a shielded harness relating to a first embodiment of the invention.
Figure 2:
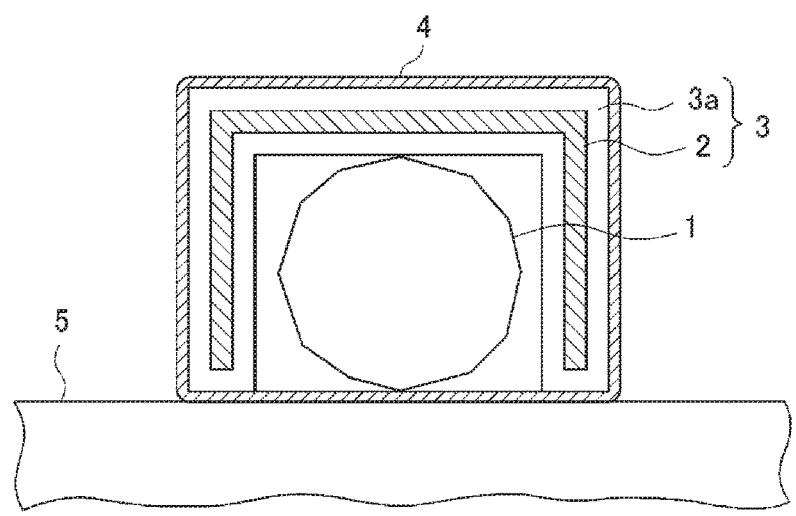
FIG. 2 is an enlarged sectional view showing a part of the shielded harness relating to the first embodiment of the invention.
Figure 3:
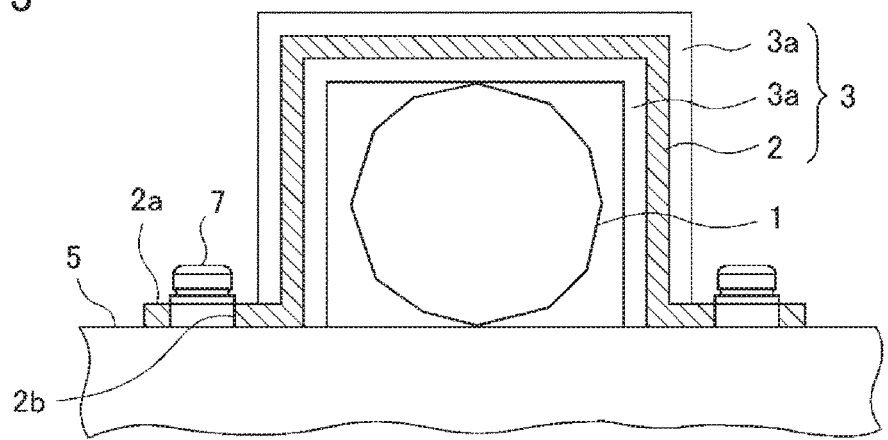
FIG. 3 is an enlarged sectional view showing a part of the shielded harness relating to the first embodiment of the invention.

Hereinafter, a shielded harness relating to a first embodiment of the invention will be described by referring to drawings. FIG. 1 is a perspective view showing the shielded harness relating to the first embodiment. FIG. 2 is an enlarged sectional view of a part taken along the line A-A in FIG. 1. FIG. 3 is an enlarged sectional view of a part taken along the line B-B in FIG. 1. It is noted that the same or corresponding parts are indicated by the same symbols in the drawings.

The shielded harness relating to the first embodiment includes covered wires 1, a molded body 3, a tape 4, a metal casing 5, a connector 6, and metal screws 7. Each of the covered wires 1 is insulated by covering a wire with polyvinyl chloride, polyethylene, fluororesin such as Teflon (registered trademark) resin, polyester, silicone, or any other insulative material. The multiple covered wires 1 of the first embodiment are bundled. Although FIG. 1 shows only the connector 6 that is connected to ends of the covered wires 1, a connector (not shown) of the other ends of the covered wires 1 is positioned at a back surface of the metal casing 5.

The molded body 3 contains a conductive material and has a groove for receiving the covered wires 1. The groove of the molded body 3 has a U shape cross section and is arranged to surround the covered wires 1 from three directions. The molded body 3 of the first embodiment includes a conductive metal plate 2 and an insulative resin 3a that covers the metal plate 2, and the metal plate 2 is formed into a U shape and is integrally formed with the insulative resin 3a by insert molding. Parts of the metal plate 2 are exposed from the insulative resin 3a and form leg parts 2a for fixing.

The tape 4 covers a part of the opening of the molded body 3 to secure the covered wires 1 in the inside of the groove of the molded body 3. In the example shown in FIG. 1, the covered wires 1 are fitted into the groove of the molded body 3, and then the tape 4 is wound around an approximately center part of the molded body 3.

The metal casing 5 is arranged to close the opening of the groove of the molded body 3 and is electrically connected to the molded body 3. The molded body 3 of the first embodiment is fixed to the metal casing 5 and is electrically connected to the metal casing 5 by fastening each of the metal screws 7 to a screw hole 2b and a screw hole (not shown) that is provided to the metal casing 5. The screw hole 2b is provided to each of the leg parts 2a of the metal plate 2, and the leg parts 2a are exposed from the insulative resin 3a of the molded body 3.

The shape of the molded body 3 of the first embodiment is not limited to the straight shape, as shown in FIG. 1, and the molded body 3 may be formed into a shape along a wiring route of the covered wires 1. Although the molded body 3 with the U shape has a square corner in the example shown in FIG. 2, the molded body 3 may have a round corner. The sectional shape of the molded body 3 may not be limited to the U shape and may be a V shape or a semicircular shape.

The shape of the metal casing 5 is not limited to a rectangular shape as shown in FIG. 1 and may be appropriately changed in accordance with the usage of the shielded harness. The metal casing 5 may be used as a part of a housing of an electronic device, such as a power converter, and the metal casing 5 may be partially notched, be provided with a through hole, and/or be bent.

Figure 4:
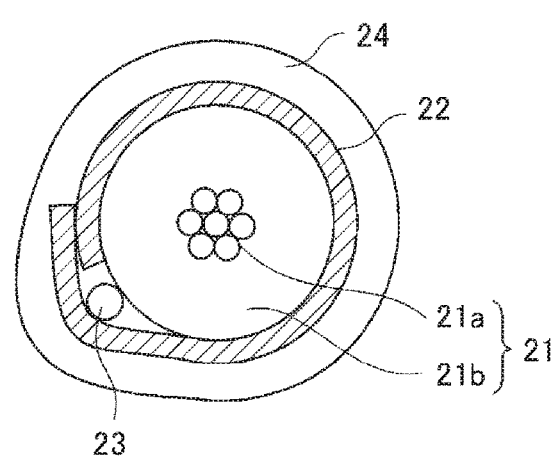
FIG. 4 is a sectional view showing a structure of a conventional shielded wire.

A structure of a conventional shielded wire is shown in FIG. 4 as a comparative example for the shielded harness relating to the first embodiment. The conventional shielded wire includes a core wire 21 that is formed by enclosing conductive wires 21a with an insulative body 21b, such as a Teflon resin. The core wire 21 is wrapped with a metal tape 22, and a drain wire 23 is also arranged to contact the metal tape 22. The drain wire 23 is fastened to a metal casing, which functions as a ground, to provide a path for conducting noise.

A sheath 24 is an insulative body that is provided at an outermost layer and is formed by extrusion molding of a thermoplastic resin, such as polyethylene, polyvinyl chloride, or fluororesin. Thus, to produce such a conventional shielded wire, a step of wrapping the core wire 21 with the metal tape 22 and a step of molding the sheath 24 are required.

On the other hand, the shielded harness relating to the first embodiment is simply constructed such that the covered wires 1 are fitted into the groove of the molded body 3, and then the opening of the groove is covered with the metal casing 5. This simple structure allows noise to be released to the metal casing 5, which functions as a ground, via the metal plate 2 constituting the molded body 3 when the noise is generated at a control system unit or comes from an external device.

The shielded harness relating to the first embodiment has a small number of parts and is thus produced by an easy method. The shielded harness relating to the first embodiment does not have the metal tape 22, the drain wire 23, and the sheath 24, which constitute the conventional shielded wire, and thus, a step of wrapping the covered wires 1 with the metal tape 22 and the step of molding the sheath 24 are not required, whereby production cost can be reduced.

The metal casing 5 of the shielded harness relating to the first embodiment can be used as a housing of a device, such as a power converter, and therefore, a fixing tool is not required for wiring, and the wiring is made easy. The inside surface of the groove of the molded body 3, which contacts the covered wires 1, is made of the insulative resin 3a, and thus, sliding wear of covers of the covered wires 1 is reduced, and breaks of the wires due to exposure are prevented. Accordingly, the first embodiment provides a shielded harness that is easy to wire and that has a simple structure with a small number of parts, thereby allowing easy production and reduction in production cost.

Second Embodiment

Figure 5:
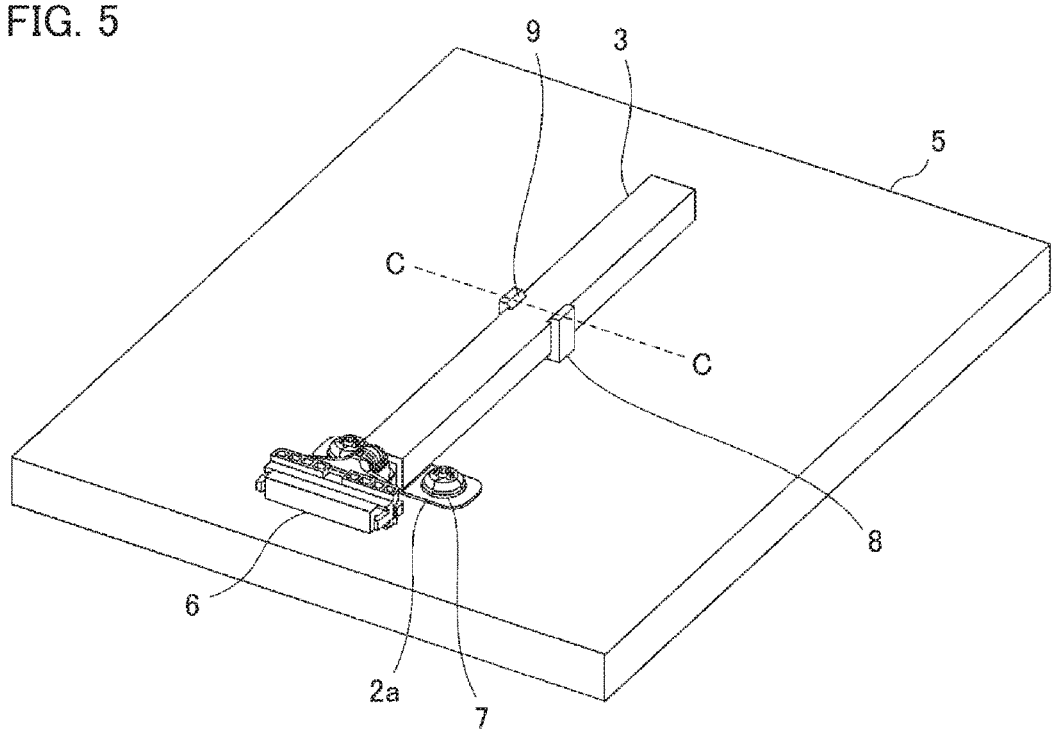
FIG. 5 is a perspective view showing a shielded harness relating to a second embodiment of the invention.
Figure 6:
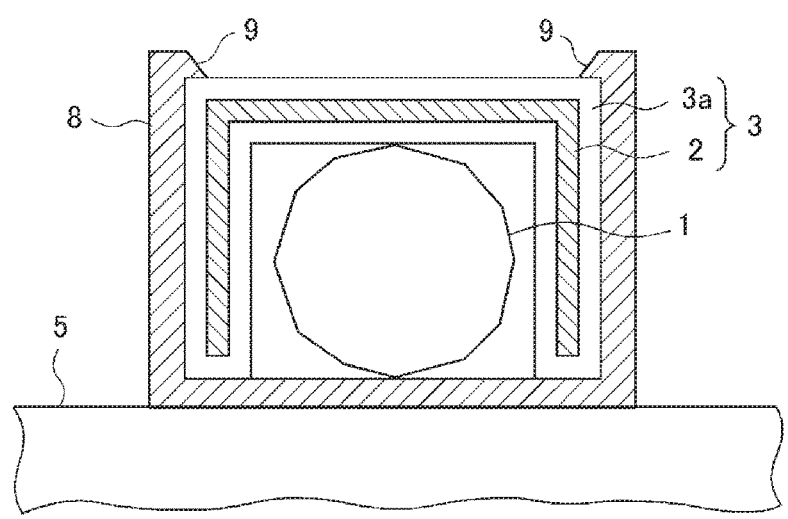
FIG. 6 is an enlarged sectional view showing a part of the shielded harness relating to the second embodiment of the invention.

FIG. 5 is a perspective view showing a shielded harness relating to a second embodiment of the invention. FIG. 6 is an enlarged sectional view of a part taken along the line C-C in FIG. 5. Although the covered wires 1 are secured in the inside of the groove of the molded body 3 with the tape 4 in the first embodiment, the second embodiment uses a resin fixing tool 8 instead of the tape 4. The other structural components are the same as those of the first embodiment, and therefore, descriptions of these structural components are not repeated.

As shown in FIG. 6, the fixing tool 8 is fitted from the opening side of the molded body 3 so as to close a part of the opening and thereby secures the covered wires 1 in the inside of the groove of the molded body 3. Although the fixing tool 8 is fixed to the molded body 3 by hooking claw parts 9 of the fixing tool 8 at the corners of the molded body 3 in FIG. 6, the claw parts 9 may be provided to the molded body 3 and may be hooked to the fixing tool 8.

The second embodiment provides effects similar to the effects of the first embodiment, and moreover, allows increase in the working efficiency and reduction in the processing cost because fitting the fixing tool 8 to the molded body 3 is easier than winding the tape 4.

Third Embodiment

Figure 7:
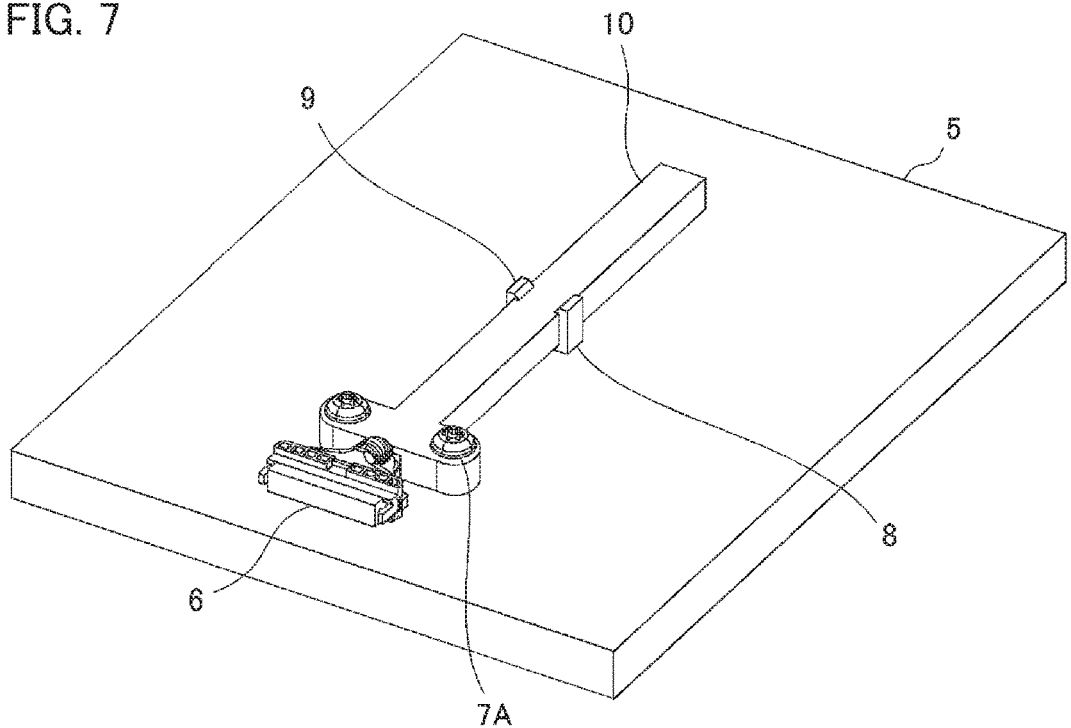
FIG. 7 is a perspective view showing a shielded harness relating to a third embodiment of the invention.
Figure 8:
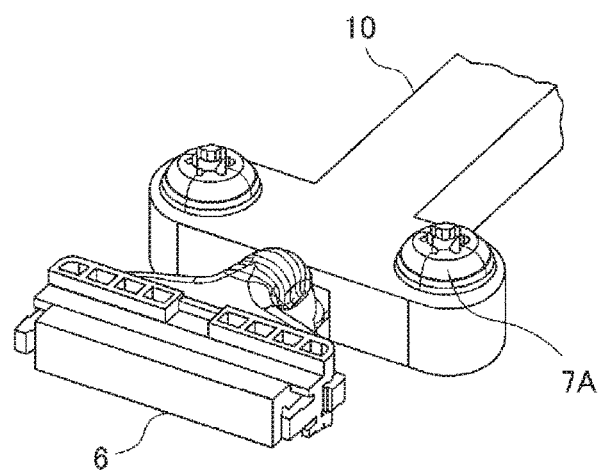
FIG. 8 is an enlarged view showing apart of the shielded harness relating to the third embodiment of the invention.

FIG. 7 is a perspective view showing a shielded harness relating to a third embodiment of the invention. FIG. 8 is an enlarged view of a part of the shielded harness relating to the third embodiment. Each of the first embodiment and the second embodiment uses the molded body 3, in which the conductive metal plate 2 and the insulative resin 3a are integrally formed. On the other hand, the third embodiment uses a molded body 10 that is made of a conductive resin. The covered wires 1 are secured in the inside of the groove of the molded body 10 by the fixing tool 8 having the claw parts 9 in the same manner as in the second embodiment. The other structural components are the same as those of the first embodiment, and therefore, descriptions of these structural components are not repeated.

The third embodiment is configured to release noise to the metal casing 5, which functions as a ground, via the molded body 10 made of the conductive resin, when the noise is generated at a control system unit or comes from an external device. The molded body 10 is fixed to the metal casing 5 by fastening each of metal screws 7A to screw holes (not shown) that are respectively provided to the molded body 10 and the metal casing 5. The conductive resin constituting the molded body 10 is preferably a synthetic resin containing a conductive metal filler, but any conductive resin may be used.

The third embodiment provides the effects similar to the effects of the first embodiment and the second embodiment, and moreover, allows reduction in the number of parts and further reduction in production cost because using the molded body 10 made of the conductive resin eliminates the need for using the metal plate 2.

Moreover, since the molded body 10 can be molded without the need for performing the insert molding, the degree of freedom of molding is increased, and a molded body 10 having a more complicated shape can be produced. Various modifications and alterations of this invention will be apparent to those skilled in the art without departing from the scope and spirit of this invention, and it should be understood that this is not limited to the illustrative embodiments set forth herein.

What is claimed is:

1. A shielded harness comprising:
   a covered wire having a connector at each end of the covered wire;
   a molded body containing a conductive material and having a groove for receiving the covered wire;
   a metal casing arranged to close an opening of the groove of the molded body and electrically connected to the molded body; and
   a fixing part that fixes the molded body to the metal casing,
   wherein the molded body is made of a conductive resin.

2. The shielded harness according to claim 1, wherein the groove of the molded body has a U shape sectional shape and surrounds the covered wire from three directions.

3. The shielded harness according to claim 1, further comprising a tape that closes a part of the opening of the molded body to secure the covered wire in the inside of the groove.

4. The shielded harness according to claim 1, further comprising a resin fixing tool that closes a part of the opening of the molded body to secure the covered wire in the inside of the groove.

5. The shielded harness according to claim 1, wherein the fixing part is a metal screw.

6. A shielded harness comprising: a covered wire having: a connector at each end of the covered wire; a molded body, containing a conductive material and having a groove for receiving the covered wire; a metal casing arranged to close an opening of the groove of the molded body and electrically connected to the molded body; a fixing part that fixes the molded body to the metal casing; and a resin fixing tool that closes a part of the opening of the molded body to secure the covered wire in the inside of the groove.

7. The shielded harness according to claim 6, wherein the molded body includes a conductive metal plate and an insulative resin that covers the metal plate, and a part of the metal plate is exposed from the insulative resin and is fixed to the metal casing with the fixing part.

8. The shielded harness according to claim 6, wherein the groove of the molded body has a U shape sectional shape and surrounds the covered wire from three directions.

9. The shielded harness according to claim 6, wherein the fixing part is a metal screw.

* * * * *